(12) United States Patent

Pollard, Jr.

(10) Patent No.: US 12,598,713 B2

(45) Date of Patent: Apr. 7, 2026

(54) METHOD AND APPARATUS FOR OPENING A RECEIVING DEVICE

(71) Applicant: DISH Network L.L.C., Englewood, CO (US)

(72) Inventor: Jimmy A. Pollard, Jr., Boiling Springs, SC (US)

(73) Assignee: DISH Network L.L.C., Englewood, CO (US)

( * ) Notice: Subject to any disclaimer, the term of this patent is extended or adjusted under 35 U.S.C. 154(b) by 188 days.

(21) Appl. No.: 18/396,670

(22) Filed: Dec. 26, 2023

(65) Prior Publication Data

US 2025/0212347 A1    Jun. 26, 2025

(51) Int. Cl.
 *E05B 47/00* (2006.01)
 *H05K 5/02* (2006.01)

(52) U.S. Cl.
 CPC ....... *H05K 5/0221* (2013.01); *E05B 47/0001* (2013.01); *E05B 2047/0024* (2013.01)

(58) Field of Classification Search
 CPC .... Y10S 292/37; Y10S 292/53; Y10S 292/54; Y10S 292/64; Y10T 292/0846; Y10T 292/0847; Y10T 292/0854; Y10T 292/0859; Y10T 292/086; Y10T 292/0894; Y10T 292/0895; Y10T 292/0898; Y10T 292/09; Y10T 292/0902; Y10T 292/0907; Y10T 292/03; E05B 2047/0024; E05B 47/0001; H05K 5/0221
 See application file for complete search history.

(56) References Cited

U.S. PATENT DOCUMENTS

| | | | | | |
|---|---|---|---|---|---|
| 3,841,518 | A | * | 10/1974 | Hines | E05C 19/06 |
| | | | | | 292/85 |
| 4,673,100 | A | * | 6/1987 | Reis | H05K 5/15 |
| | | | | | 292/87 |
| 4,698,024 | A | * | 10/1987 | Maxwell | H05K 7/1409 |
| | | | | | 361/752 |
| 4,893,263 | A | * | 1/1990 | Myers | G06F 1/1656 |
| | | | | | 439/352 |
| 5,398,162 | A | * | 3/1995 | Bice | H05K 7/1409 |
| | | | | | 361/740 |
| 6,006,941 | A | * | 12/1999 | Hitchings | E05C 19/06 |
| | | | | | 220/326 |
| 6,318,134 | B1 | * | 11/2001 | Mossberg | E05B 65/5292 |
| | | | | | 292/144 |
| 6,741,474 | B1 | * | 5/2004 | Hung | H05K 7/1494 |
| | | | | | 292/87 |

(Continued)

FOREIGN PATENT DOCUMENTS

| | | | | | | |
|---|---|---|---|---|---|---|
| CN | | 108012484 A | * | 5/2018 | | H05K 5/0221 |
| CN | | 115443012 A | * | 12/2022 | | H05K 5/023 |
| DE | | 1911947 A1 | * | 9/1970 | | |

*Primary Examiner* — Carlos Lugo

(74) *Attorney, Agent, or Firm* — Perkins Coie LLP

(57) ABSTRACT

A receiver opening apparatus opens receiving devices such as a set-top box or a digital video recorder. This apparatus uses processor-controlled pins and actuators, guided by micro switches and a programmable logic controller (PLC), to precisely unlatch the receiver's securing clips without causing damage. The apparatus is designed to accommodate various receiver models and incorporates hardened steel pins and vacuum cups to securely hold and open devices for servicing.

20 Claims, 17 Drawing Sheets

(56)  References Cited

U.S. PATENT DOCUMENTS

| 6,874,828 | B2 * | 4/2005 | Roatis | G07F 9/10 |
| | | | | 292/201 |
| 7,338,096 | B2 * | 3/2008 | Si | E05C 19/06 |
| | | | | 292/87 |
| 8,038,184 | B2 * | 10/2011 | Grigis | E05C 3/14 |
| | | | | 292/87 |
| 8,267,443 | B1 * | 9/2012 | Kuo | G06F 1/181 |
| | | | | 292/87 |
| 8,424,927 | B2 * | 4/2013 | Tsai | F16B 5/0664 |
| | | | | 292/87 |
| 8,760,870 | B2 * | 6/2014 | Yamamoto | G02B 6/4201 |
| | | | | 361/728 |
| 9,245,818 | B2 * | 1/2016 | Boyd | H05K 3/301 |
| 9,549,474 | B2 * | 1/2017 | Hu | H05K 5/03 |
| 10,366,846 | B2 * | 7/2019 | Sinthomez | H01H 71/56 |
| 10,837,207 | B2 * | 11/2020 | Lorek | E05C 3/12 |
| 11,659,907 | B2 * | 5/2023 | Matthews, Jr. | G06F 1/1616 |
| | | | | 206/320 |
| 11,800,666 | B2 * | 10/2023 | Singer | H05K 5/03 |
| 2006/0213239 | A1 * | 9/2006 | Roatis | E05B 47/023 |
| | | | | 70/278.1 |
| 2018/0023321 | A1 * | 1/2018 | Van Landingham, Jr. | |
| | | | | E05B 15/1607 |
| | | | | 70/280 |

* cited by examiner

100

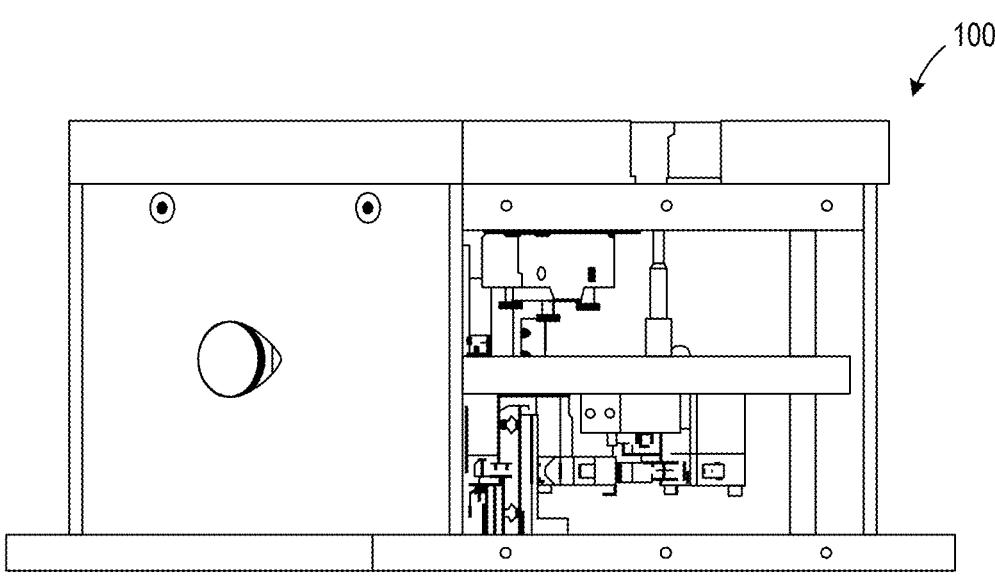

| Providing at least one processor coupled to at least one memory |
|---|

1420

| Initiating an opening process |
|---|

1430

| Responsive to the opening process being initiated, lifting at least one pin through a hold in a bottom plate of a receiving device |
|---|

1440

| Stopping the lifting when the at least one pin meets a micro switch |
|---|

1450

| Responsive to meeting the micro switch and stopping the lifting, turning the at least one pin at predetermined number of degrees, causing the at least one pin to push out at least one protrusion of the bottom plate, the pushing out of the at least one protrusion causing a front plate of the receiving device to release from a side plate of the receiving device, thereby opening the receiving device |
|---|

METHOD AND APPARATUS FOR OPENING A RECEIVING DEVICE

BACKGROUND

A receiving device is a device capable of receiving a media stream and rendering the media stream. For example, the receiving device can be a set-top box (STB) or a digital video recorder (DVR) configured to communicate with a cable or satellite distribution network. Typically, there is no need for a user to open a receiving device, because when a problem occurs with the receiving device, the user sends the receiving device to a service repair facility, such as the originating company.

SUMMARY

In some aspects, the techniques described herein relate to a method for opening a receiving device, including: providing at least one processor coupled to at least one memory; initiating an opening process; responsive to the opening process being initiated, lifting at least one pin through a hole in a bottom plate of a receiving device; stopping the lifting when the at least one pin meets a micro switch; responsive to meeting the micro switch and stopping the lifting, turning the at least one pin at a predetermined number of degrees, causing the at least one pin to push out at least one protrusion of the bottom plate, the pushing out of the at least one protrusion causing a front plate of the receiving device to release from a side plate of the receiving device, thereby opening the receiving device.

In some aspects, the techniques described herein relate to a method, wherein the pin is configured to have a rectangular flat part, thereby causing a latch to push out when the pin is turned.

In some aspects, the techniques described herein relate to a method, wherein the receiving device is an entertainment electronic device communicably connected to a streaming device, the receiving device configured for receiving programmable content from a content broadcast provider and configured for recording the content.

In some aspects, the techniques described herein relate to a method, wherein the bottom plate is held in place by at least one suction cup.

In some aspects, the techniques described herein relate to a method, wherein the predetermined number of degrees is substantially 90 degrees.

In some aspects, the techniques described herein relate to a method, wherein the opening process is on a timed cycle, the timed cycle including a predetermined amount of time past the initiating the opening process that provides time for the operations: (a) turning the at least one pin in the reverse direction and (b) subsequently lowering the at least one pin back through the hole in the bottom plate.

In some aspects, the techniques described herein relate to a method, wherein the at least one pin is configured with an embedded programmable logic controller (PLC) and a camshaft actuator, wherein the PLC is communicably connected to the micro switch and the camshaft actuator; wherein the PLC causes the lifting of the at least one pin by sending a first signal to the camshaft actuator; wherein, when the at least one pin meets the micro switch, the micro switch sends a second signal to the PLC, the second signal instructing the PLC to send a third signal to the camshaft actuator to cause the camshaft actuator to turn, thereby turning the pin.

In some aspects, the techniques described herein relate to a method, further including stopping the turning when the pin meets a second micro switch, causing the second micro switch to send a fourth signal to the PLC, the fourth signal instructing the PLC to send a fifth signal to the camshaft actuator, the fifth signal instructing the camshaft actuator to stop and reverse turn.

In some aspects, the techniques described herein relate to a method, wherein the second micro switch is a miniature snap-acting switch.

In some aspects, the techniques described herein relate to a method, wherein the at least one protrusion is a latch protrusion of a lock mechanism, the lock mechanism including a latch arm and the latch protrusion protruding through a hole in a plastic clip of the receiving device.

In some aspects, the techniques described herein relate to an apparatus for opening a receiving device, including: a panel including at least one processor coupled to at least one memory; an indicator on the panel configured to initiate an opening process upon an actionable event; an ejector pin for opening the receiving device; a rotary cylinder coupling configured to hold the ejector pin; a first rotary cylinder configured to rotate the ejector pin; a lift cylinder configured to push up the rotary cylinder to lift the pin through a hole in a bottom plate of the receiving device; a first micro switch configured to indicate that receiving device is in place for a cycle of the opening process; a second micro switch configured to stop the rotation of the ejector pin when the pin meets the second micro switch; a cam rotary cylinder configured to rotate with the pin enabling the pint to touch the second micro switch to stop the rotation indicating that the pin has reached a required distance; wherein the rotation of the pin causes the pin to push out at least one protrusion of the bottom plate, the pushing out of the at least one protrusion causing a front plate of the receiving device to release from a side plate of the receiving device, thereby opening the receiving device.

In some aspects, the techniques described herein relate to an apparatus, wherein the pin is configured to have a rectangular flat part, thereby causing a latch to push out when the pin is rotated.

In some aspects, the techniques described herein relate to an apparatus, wherein the receiving device is an entertainment electronic device communicably connected to a streaming device, the receiving device configured for receiving programmable content from a content broadcast provider and configured for recording the content.

In some aspects, the techniques described herein relate to an apparatus, wherein the bottom plate is held in place by at least one suction cup.

In some aspects, the techniques described herein relate to an apparatus, wherein the rotation of the pin is substantially 90 degrees.

In some aspects, the techniques described herein relate to an apparatus, further including a time cycle, wherein the opening process is programmed to execute based on the timed cycle, the timed cycle including a predetermined amount of time past the initiation of the opening process to provide time for the operations: (a) to turn the pin in the reverse direction and (b) subsequently lower the pin back through the hole in the bottom plate.

In some aspects, the techniques described herein relate to an apparatus, wherein the pin is configured with an embedded programmable logic controller (PLC) and a camshaft actuator, wherein the PLC is communicably connected to any of: the first micro switch, the second micro switch, the first rotary cylinder, the lift cylinder, or the cam rotary cylinder; wherein the PLC causes the lifting of the pin by sending a first signal to the cam rotary cylinder; wherein, when the pin meets the second micro switch, the second micro switch sends a second signal to the PLC, the second signal instructing the PLC to send a third signal to the cam rotary cylinder to cause the cam rotary cylinder to turn, thereby turning the pin.

In some aspects, the techniques described herein relate to an apparatus, further including an operation of stopping the turning when the pin meets the second micro switch, causing the second micro switch to send a fourth signal to the PLC, the fourth signal instructing the PLC to send a fifth signal to the cam rotary cylinder, the fifth signal instructing the camshaft actuator to stop and reverse turn.

In some aspects, the techniques described herein relate to an apparatus, wherein the second micro switch is a miniature snap-acting switch.

In some aspects, the techniques described herein relate to an apparatus, wherein the at least one protrusion is a latch protrusion of a lock mechanism, the lock mechanism including a latch arm and the latch protrusion protruding through a hole in a plastic clip of the receiving device.

BRIEF DESCRIPTION OF THE DRAWINGS

The systems and methods described herein may be better understood by referring to the following Detailed Description in conjunction with the accompanying drawings, in which like reference numerals indicate identical or functionally similar elements:

FIG. 1A is a schematic diagram of an apparatus on which the receiving device (e.g., the Joey TV Receiver) can be opened, consistent with embodiments herein.

FIG. 14 is a flowchart of an example method for a receiver opening process at a high level, consistent with embodiments herein.

Figure 1B:
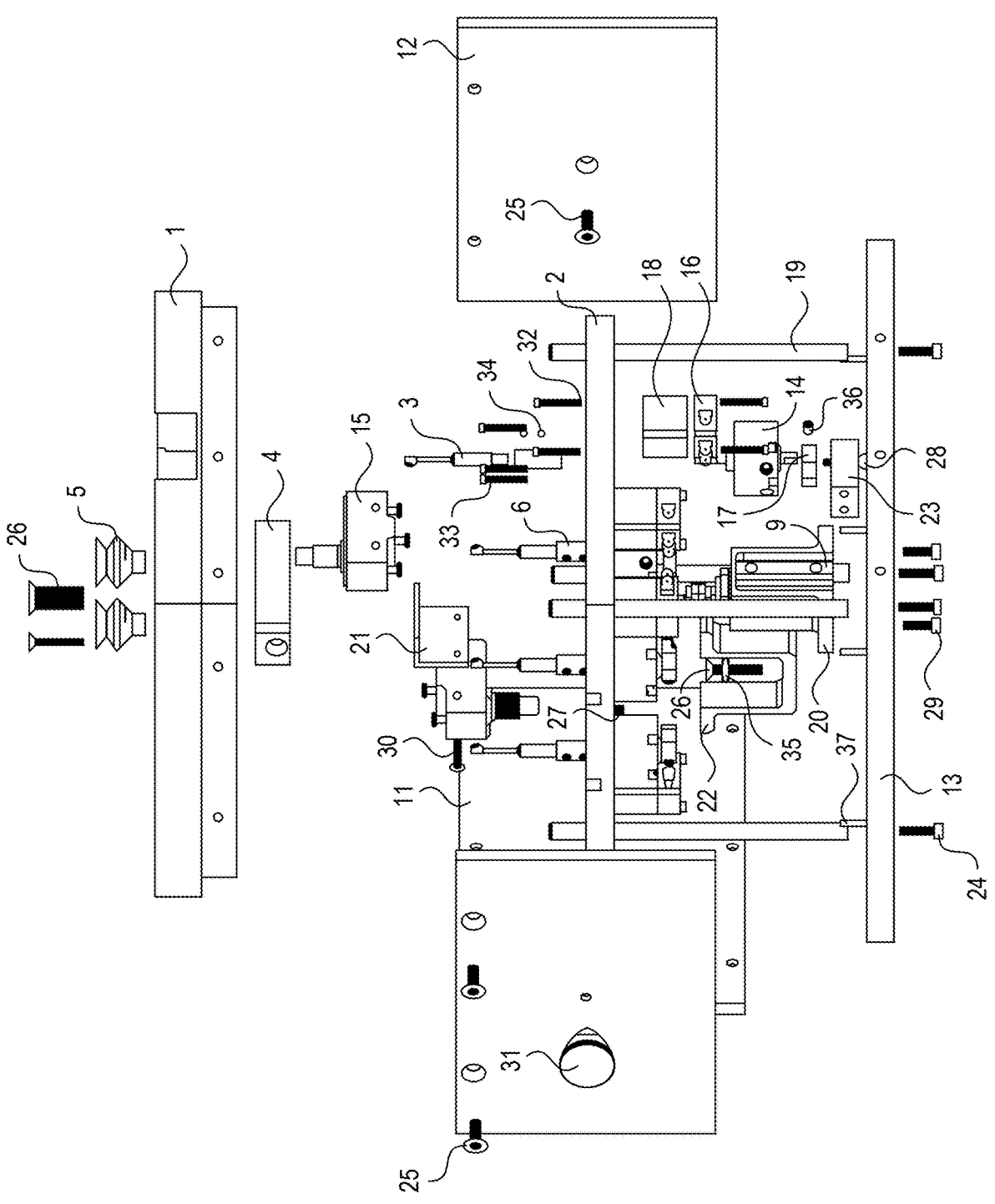
FIG. 1B is a schematic diagram of a magnification of the apparatus of FIG. 1A, showing the components thereof, consistent with embodiments herein.

The headings provided herein are for convenience only and do not necessarily affect the scope of the embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, combinations, equivalents, and alternatives falling within the scope of this disclosure.

DETAILED DESCRIPTION

It has been found that at a device (e.g., a receiving device, also referred to herein as a receiver) servicing plant, it takes a repair technician approximately three minutes to open a receiving device, such as a Joey TV Receiver by DISH Network L.L.C. (Englewood, CO). For example, in the case of the Joey TV Receiver, the front (or top) plate of the receiver is secured (e.g., snapped or locked) to the bottom plate of the receiver by a latch protrusion mechanism. Also, the productivity measurement attributed to the technicians for servicing many receivers was about 55%. For instance, the amount of receivers that were getting damaged by the manual (e.g., by hand) process of opening rendered a productivity rate for fixing the receivers to about 55%. The innovation described herein, the automated process, has been found to reduce the amount of receivers damaged by the manual opening process such as to increase such productivity to 99%. The innovation has been found to reduce the time it takes to open the receiver to about 10-15 seconds, which led to the increased productivity of 99%. As mentioned, the innovation has been found to prevent technicians from inadvertently damaging the receiver. For example, when some of the parts of the receiver, such as the clipping latches, are made of injectable plastic, the precisions are not exact, making it harder for technicians to open some receivers than other receivers. Such receivers are susceptible to being broken when a technician tries to force separating the top plate of the receiver from the bottom plate to open the receiver.

The receiving device may be any device capable of receiving a media stream and rendering the media stream. For example, the receiving device may be a set-top box (STB) or a digital video recorder (DVR) configured to communicate with a cable or satellite distribution network.

An embodiment can be understood with reference to FIG. 14, a flowchart of an example method for a receiver opening process at a high level.

At step 1410, an embodiment includes providing at least one processor coupled to at least one memory.

At step 1420, the at least one processor initiates the opening process.

At step 1430, responsive to the opening process being initiated, an actuator lifts at least one pin through a hole in a bottom plate of a receiving device.

At step 1440, the least one processor stops the lifting the at least one pin when such pin meets a micro switch.

At step 1450, responsive to the at least one pin meeting the micro switch and stopping the lifting, the at least one processor turns the at least one pin at a predetermined number of degrees, causing the at least one pin to push out at least one protrusion of the bottom plate, the pushing out of the at least one protrusion causing a front plate of the receiving device to release from a side plate of the receiving device, thereby opening the receiving device.

Put another way, consistent with embodiments herein, pins go up inside the receiver and when they turn, they push back the securing clips of the receiver.

An embodiment can be described with reference to FIG. 7-10.

Figures 7, 8:
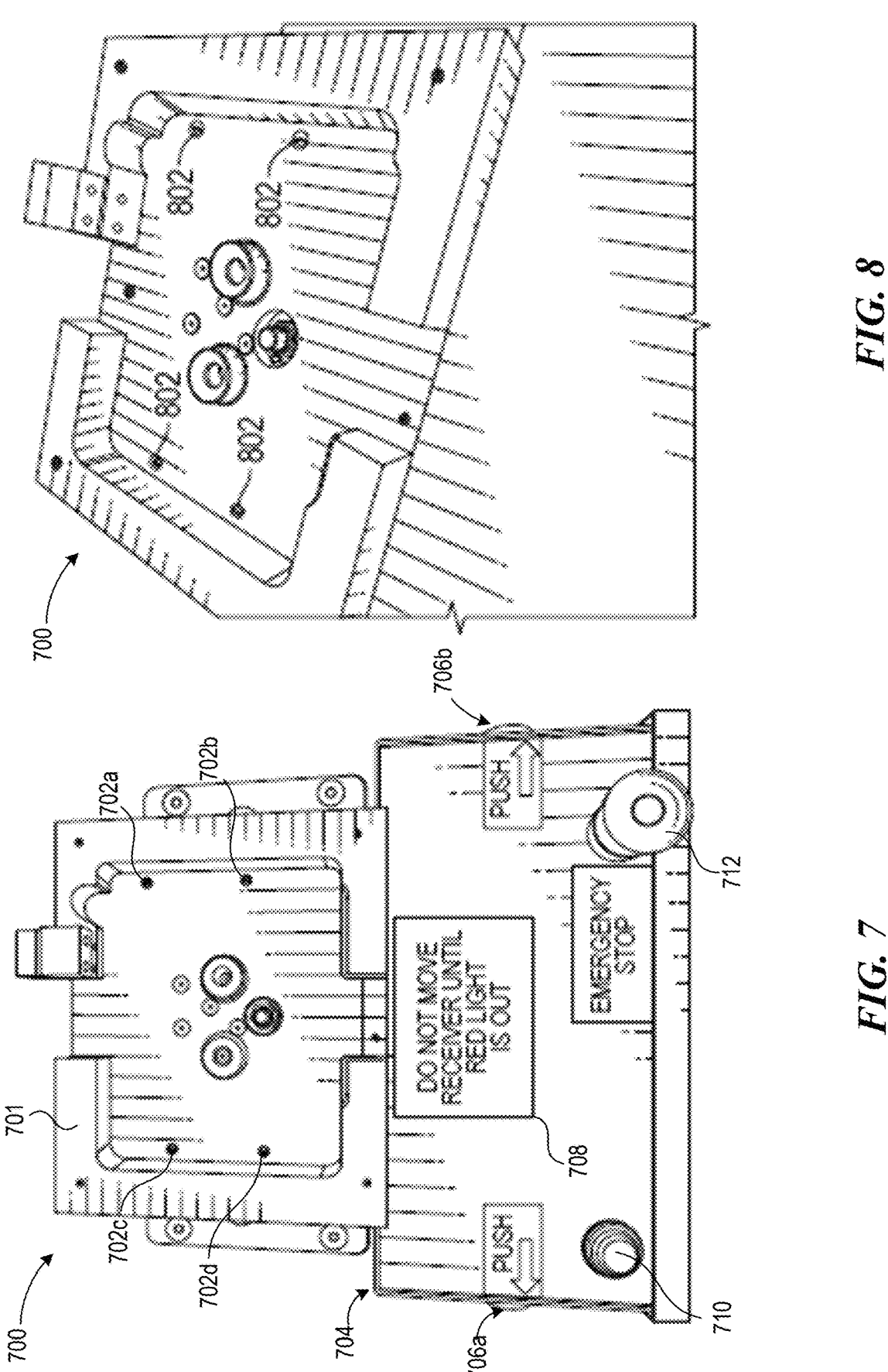
FIG. 7 is a schematic diagram of an example apparatus for opening a receiver (not shown), consistent with embodiments herein.
FIG. 8 is a schematic diagram of the example apparatus of FIG. 7, in which the four pins are shown to be in their resting or initial positions.

FIG. 7 is a schematic diagram of an example apparatus 700 for opening a receiver (not shown), consistent with embodiments herein. A receptacle for holding the receiver is shown. The receptacle 700 has four openings for four pins 702a, 702b, 702c, 702d to protrude through corresponding holes in the receiver. The four pins 702a, 702b, 702c, 702d are shown in their starting position. Two pins 702a, 702b are located on the right side of the receptacle 701 and the other two pins 702c, 702d are located on the left side of the receptacle 701. It should be appreciated that the number of pins used are the same number as the tabs in the receiver. Each of such pins are aligned with each of a tab in the receiver.

A bottom portion of the apparatus is a panel 704 containing one or more processors coupled to one or more memories for sending and receiving signals from the pins and micro switches inside the receiver. In an embodiment, a micro switch is placed onto the receiver. Such micro switch is there to indicate when receiver is in place to start the cycle of the opening process. In an embodiment, two knobs 706a, 706b are integrated into the panel 704. In this example, they are labeled with "PUSH" stickers so that the technician is reminded of where and how to initiate the opening process. The two knobs 706a, 706b are by way of example only and are not limiting. For example, the opening process can be initiated by a single knob. In an embodiment, such knobs are communicably connected to the PLC by radio waves.

The panel 704 also has a sticker 708 to remind the technician not to move the receiver until the red light is out. As an example, shown in FIG. 7 is a sticker 708 having the words, DO NOT MOVE RECEIVER UNTIL RED LIGHT IS OUT. This is because, consistent with embodiments herein, the pins protruding through the receiver cause the top lid of the receiver to pop open, which is described in more detail below. It has been found that should the technician remove the receiver from the receptacle before the pins lower back through the hole inside the receiver and return to their starting position, the pins might break. Thus, consistent with embodiments herein, the technician is encouraged to wait until the opening process completes.

Also shown on this panel, in the lower left hand corner, is a light bulb 710 that indicates to the technician whether the opening process is in ongoing or has stopped/not started. It should be appreciated that other indicators can be used in the innovation such as but not limited to audio indicators (e.g., a voice saying something to the effect that the opening process has not completed), tactile indicators (e.g., the panel could vibrate indicating that the opening process has not completed), and other visual indicators (e.g., a yellow flashing small light).

Also shown on this panel 704 is a mechanism for overriding and stopping the opening process. Shown here is a large push button 712 that is communicably connected to the processor to stop the opening process. In an embodiment, the stop button is controlled by a programmable logic controller (PLC). That is, such stop button is an emergency stop that is tied into, or communicably connected to, the PLC. Also shown on this panel is an emergency stop sticker to show clearly to the technician where and how they can manually override and stop the opening process.

It should be appreciated that the above-mentioned stickers are not shown in the remaining figures, so as not to obfuscate those views.

FIG. 8 is a schematic diagram of the example apparatus 700 of FIG. 7, in which the four pins are shown to be in their resting or initial positions 802.

Figures 9, 10:
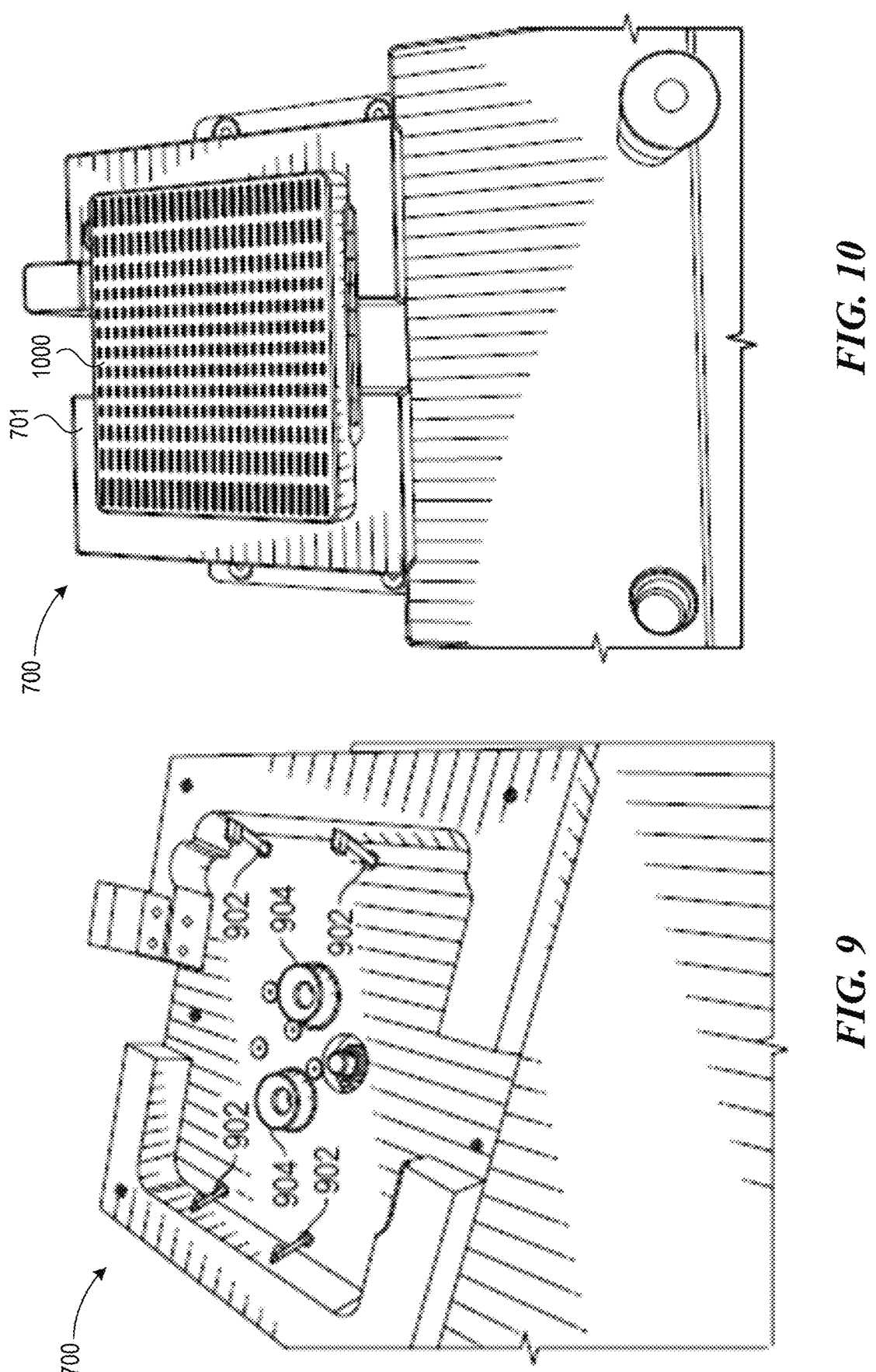
FIG. 9 is a schematic diagram of the example apparatus of FIG. 7, which shows the four pins in their lifted positions.
FIG. 10 is a schematic diagram of the example apparatus of FIG. 7 with the receiver in place, in the receptacle.

FIG. 9 is a schematic diagram of the example apparatus 700 of FIG. 7, which shows the four pins in their lifted positions 902. It should be appreciated that here, in this embodiment without a receiver in place, the pins stop ascending by the stroke of the actuator and the pin holder. Both of these are adjustable. Also shown are suction cups 904. Consistent with embodiments herein, suction cups 904 are provided that hold the bottom plate of the receiver in place. Thus, as the clips are unlatched or released, the top plate of the receiver pops off and the bottom plate does not move and impede the popping off motion.

FIG. 10 is a schematic diagram of the example apparatus 700 of FIG. 7 with the receiver 1000 in place, in the receptacle 701.

FIG. 11A-11D are schematic diagrams depicting a technician using the opening process and the apparatus 700 of FIG. 7 to open a receiver 1000, consistent with embodiments herein.

Figure 11A:
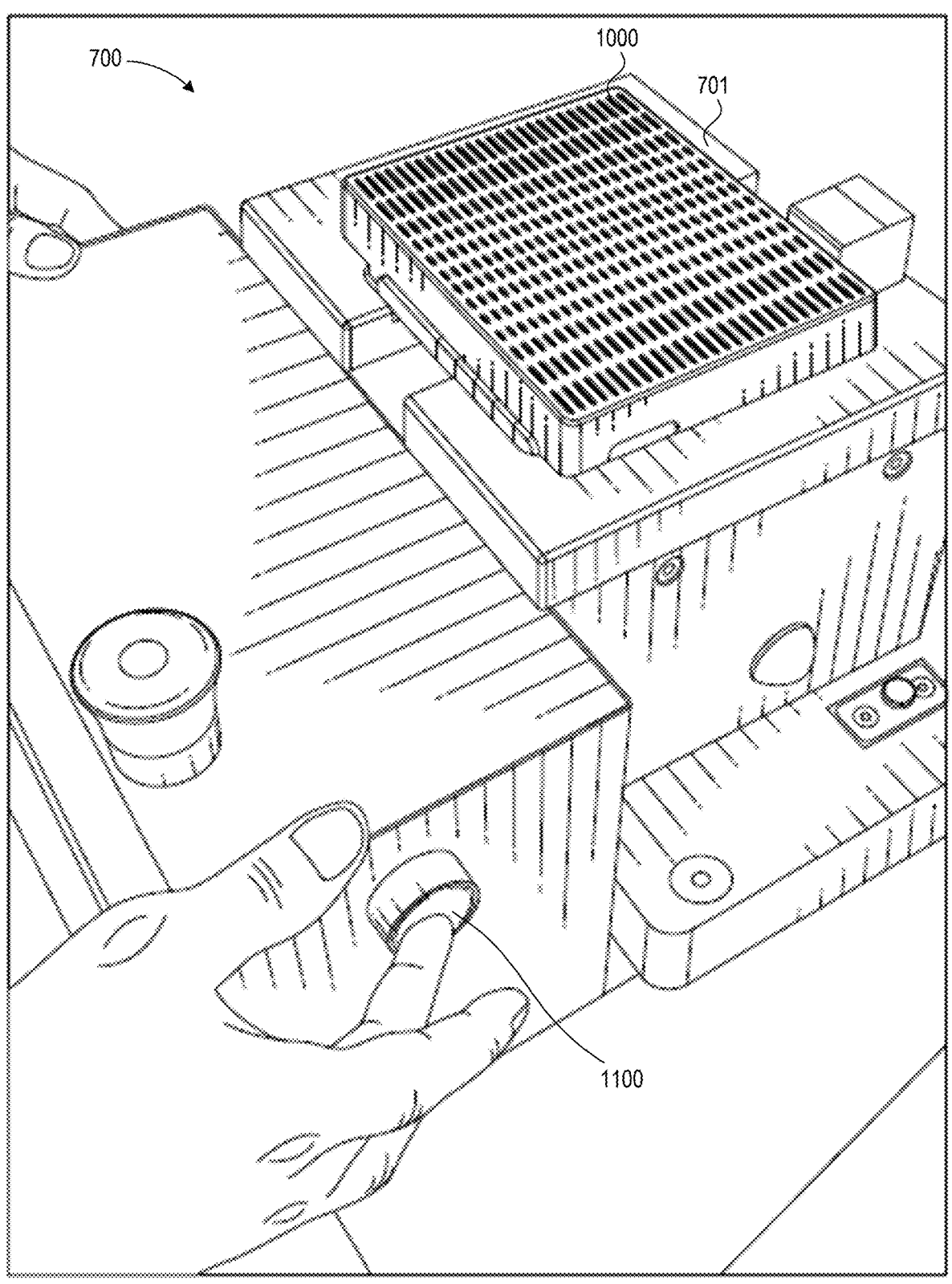
FIG. 11A is a schematic diagram showing the receiver in the receptacle and the user pushing the buttons on the side of the panel to start the opening process.

FIG. 11A is a schematic diagram showing the receiver 1000 in the receptacle and the user pushing the buttons 1100 on the side of the panel to start the opening process.

Figure 11B:
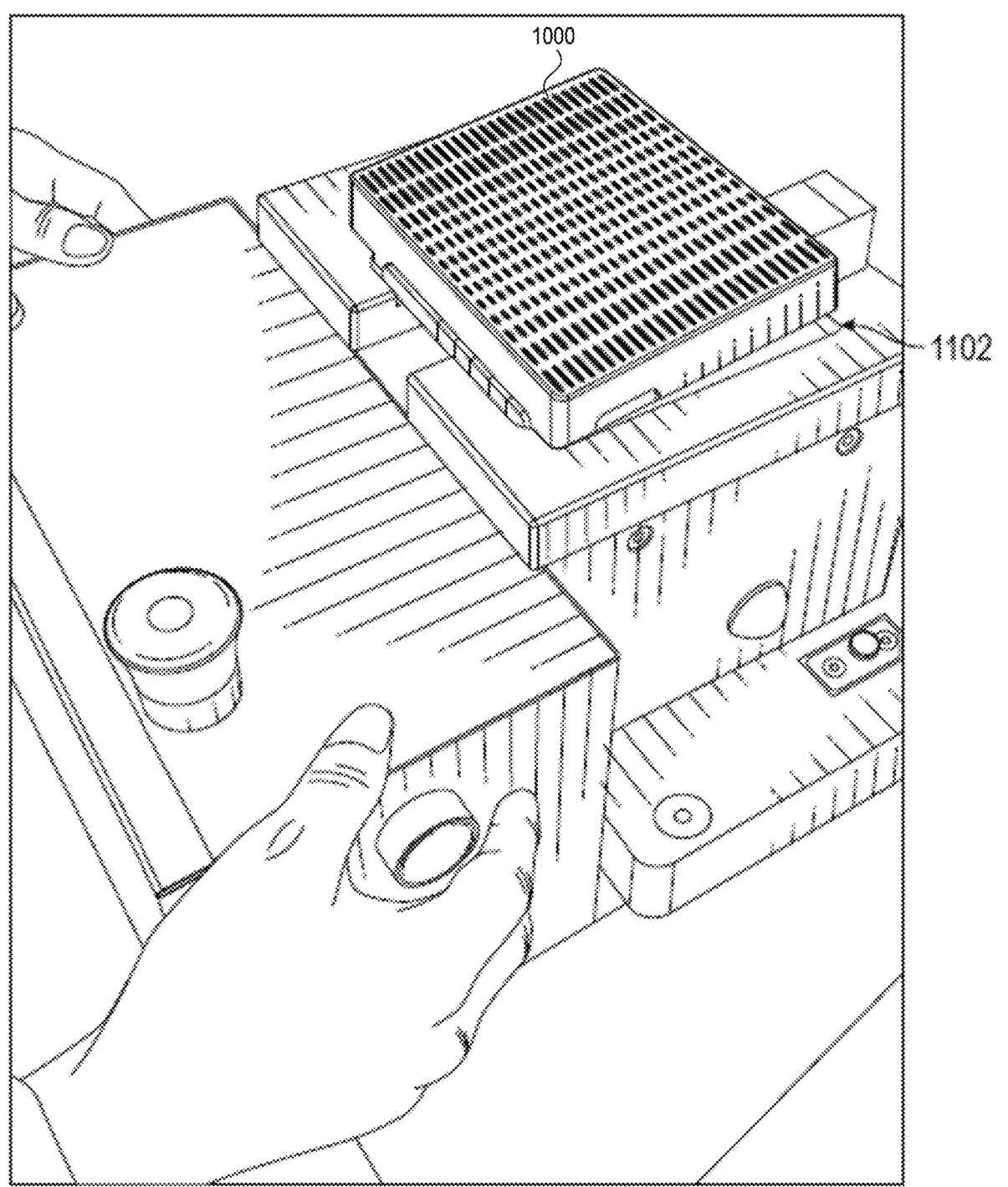
FIG. 11B is a schematic diagram showing that the cover of the receiver has been popped open.

FIG. 11B is a schematic diagram showing that the cover of the receiver 1000 has been popped open 1102.

Figure 11C:
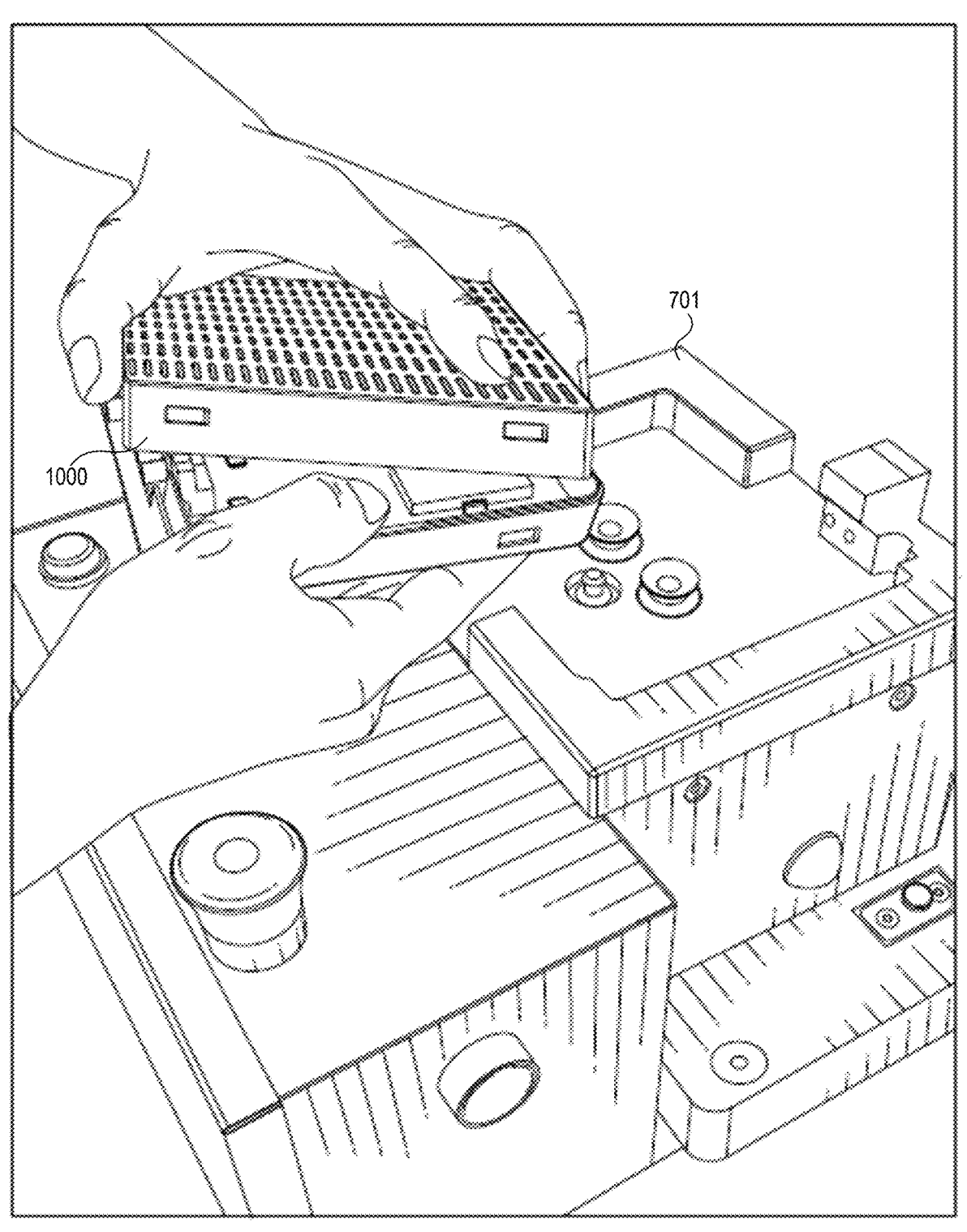
FIG. 11C is a schematic diagram showing how easily the technician can take the top cover off after removing the receiving from the apparatus.

FIG. 11C is a schematic diagram showing how easily the technician can take the top cover off after removing the receiver 1000 from the receptacle 701.

Figure 11D:
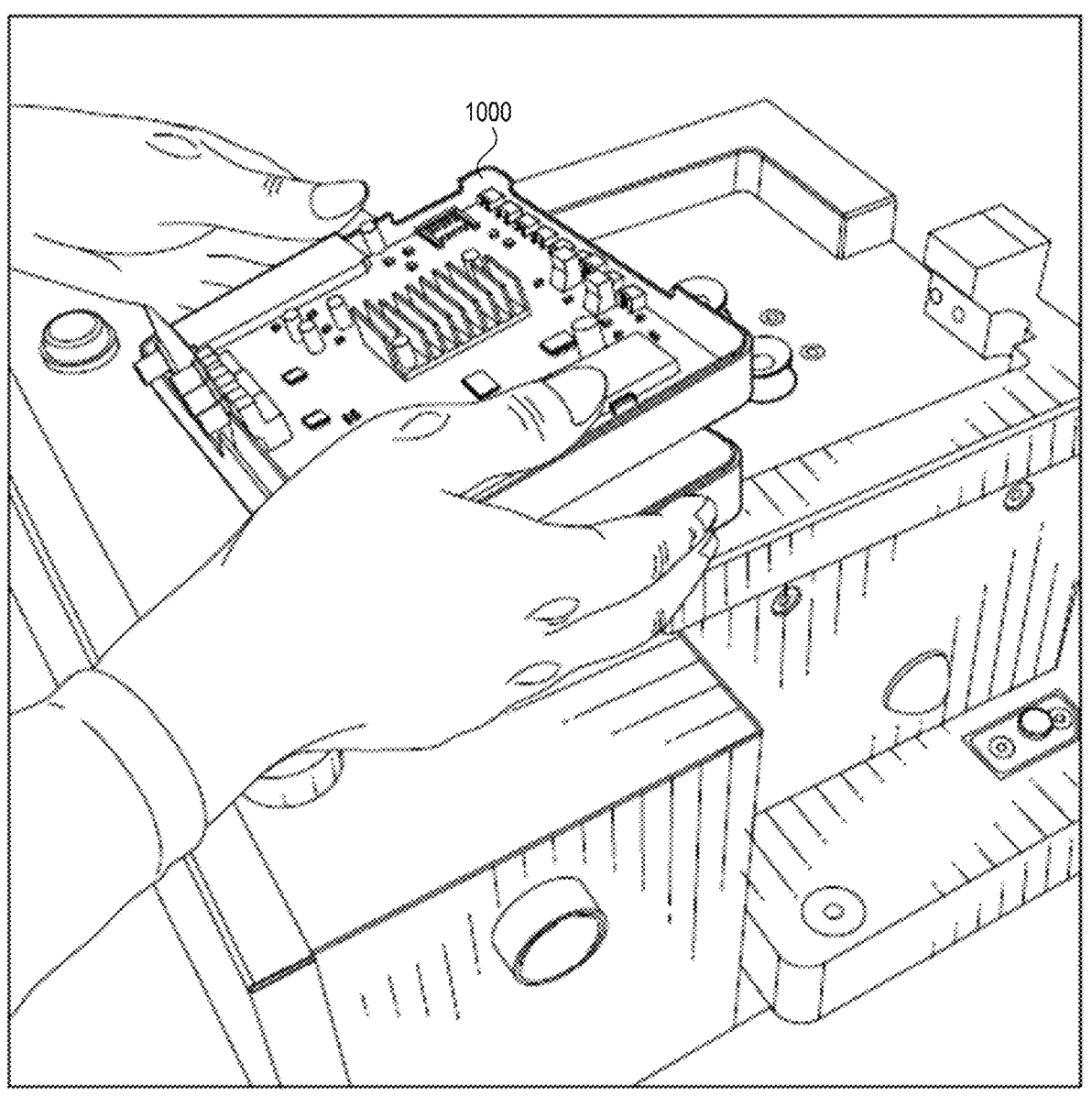
FIG. 11D is a schematic diagram showing the insides of the receiver for the technician to complete his servicing tasks on the receiver.

FIG. 11D is a schematic diagram showing the insides of the receiver 1000 for the technician to complete his servicing tasks on the receiver.

Figure 12A:
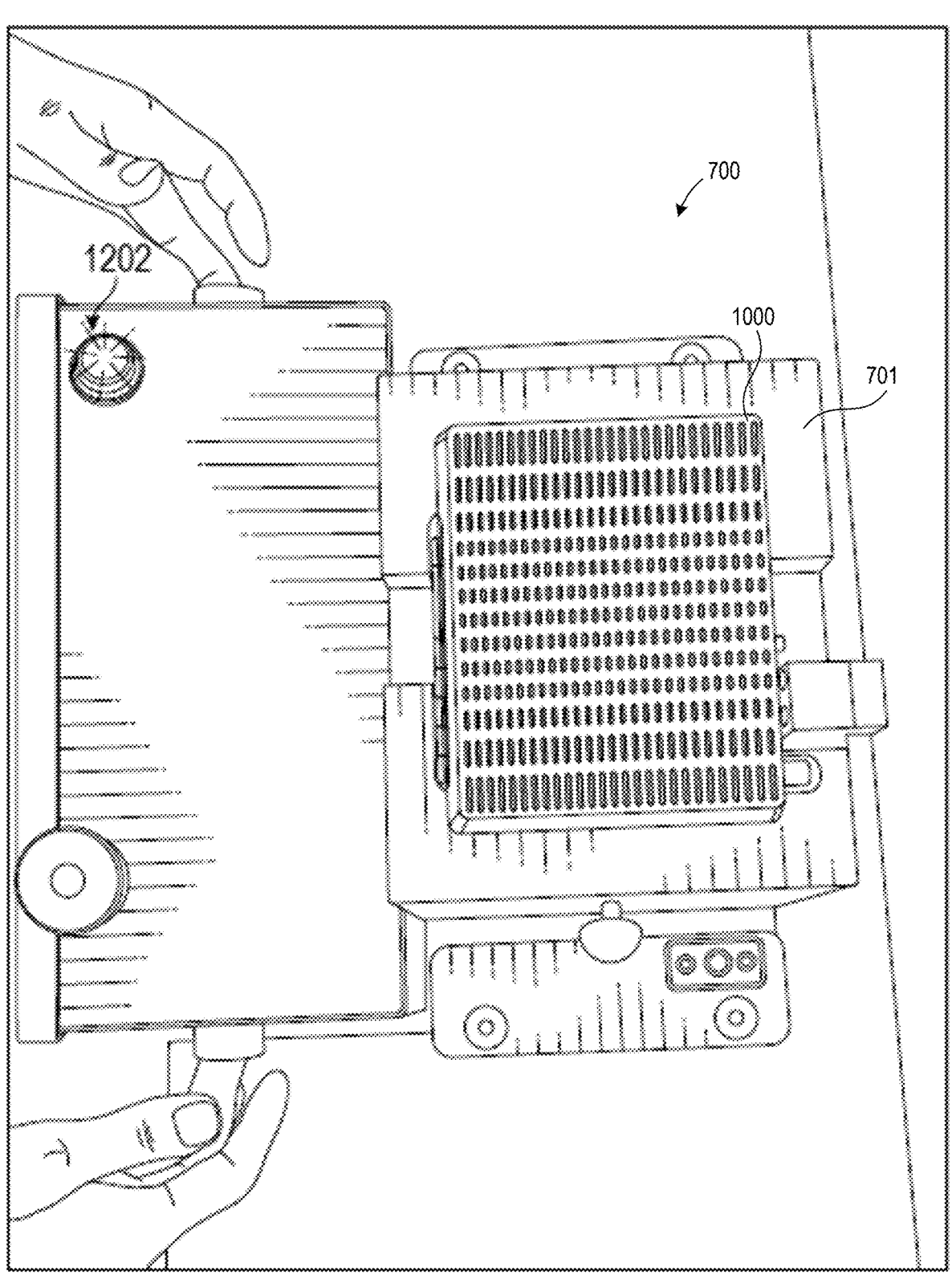
FIG. 12A is a schematic diagram showing the apparatus of FIG. 7 with the receiver in the receptacle such as in FIG. 10, with the light indicator turned on, indicating that the opening process has started and is in session.

FIG. 12A is a schematic diagram showing the apparatus 700 of FIG. 7 with the receiver 1000 in the receptacle 701 such as in FIG. 10, with the light indicator turned on 1202, indicating that the opening process has started and is in session.

Figure 12B:
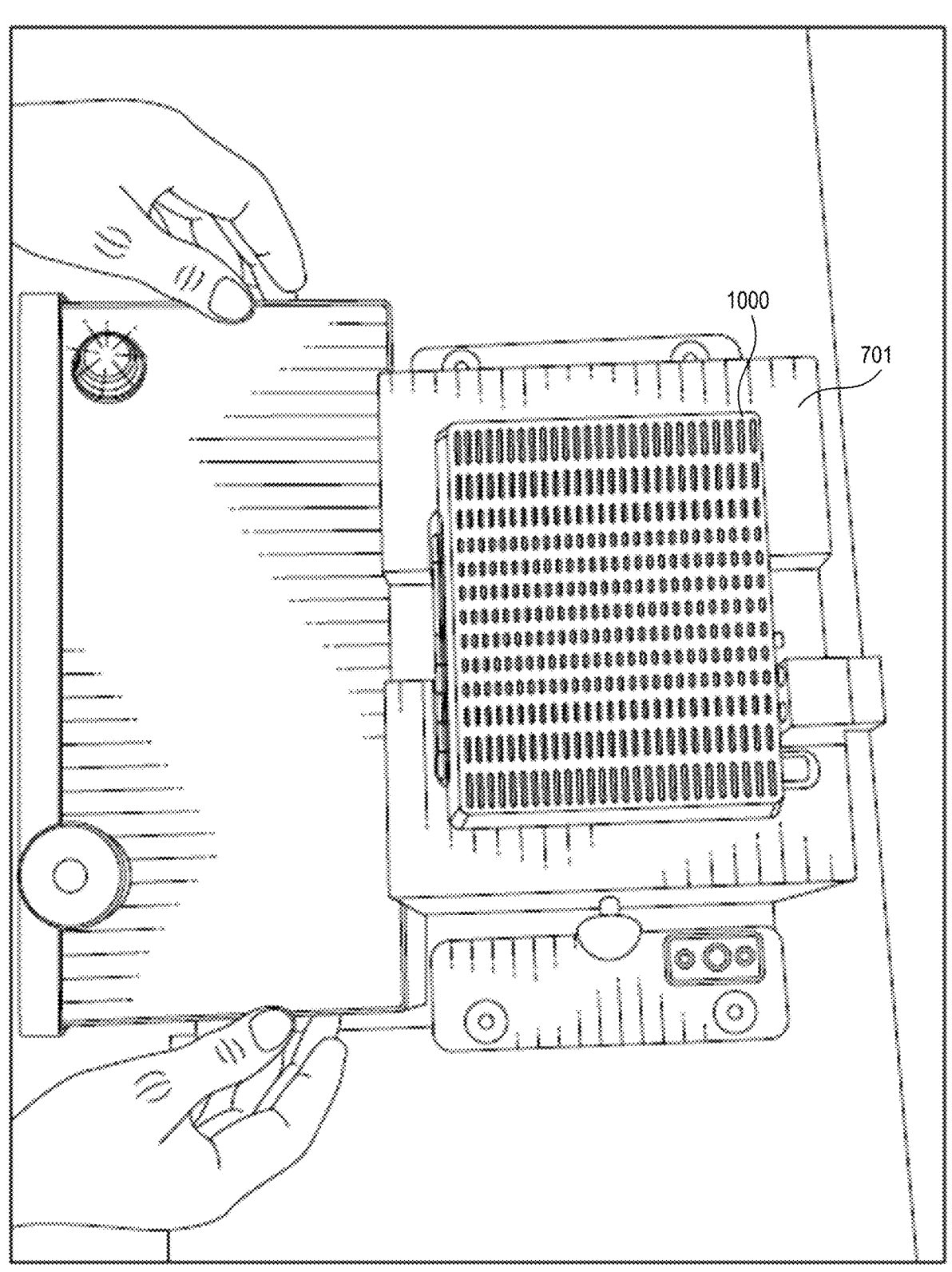
FIG. 12B is a schematic diagram showing that the opening process initiated in FIG. 12A has popped open the receiver, yet the light indicator is still on, and the technician has not begun trying to take the receiver out of the receptacle.

FIG. 12B is a schematic diagram showing that the opening process initiated in FIG. 12A has popped open the receiver 1000, yet the light indicator is still on, and the technician has not begun trying to take the receiver 1000 out of the receptacle 701. The technician is waiting for the light to go off, indicating that the opening process has completed its cycle and that the pins are safely back into their starting positions.

In an embodiment, the process is on a timed cycle. After the process pops the lid off, the process times out. The process put the pins back to their unturned position and then drops the pins back down, safely out of the way. Also, if after the stage when the top pops up and it did not pop off all the way, the pin turns back sideways, causing the cover to latch back down again.

Figure 12C:
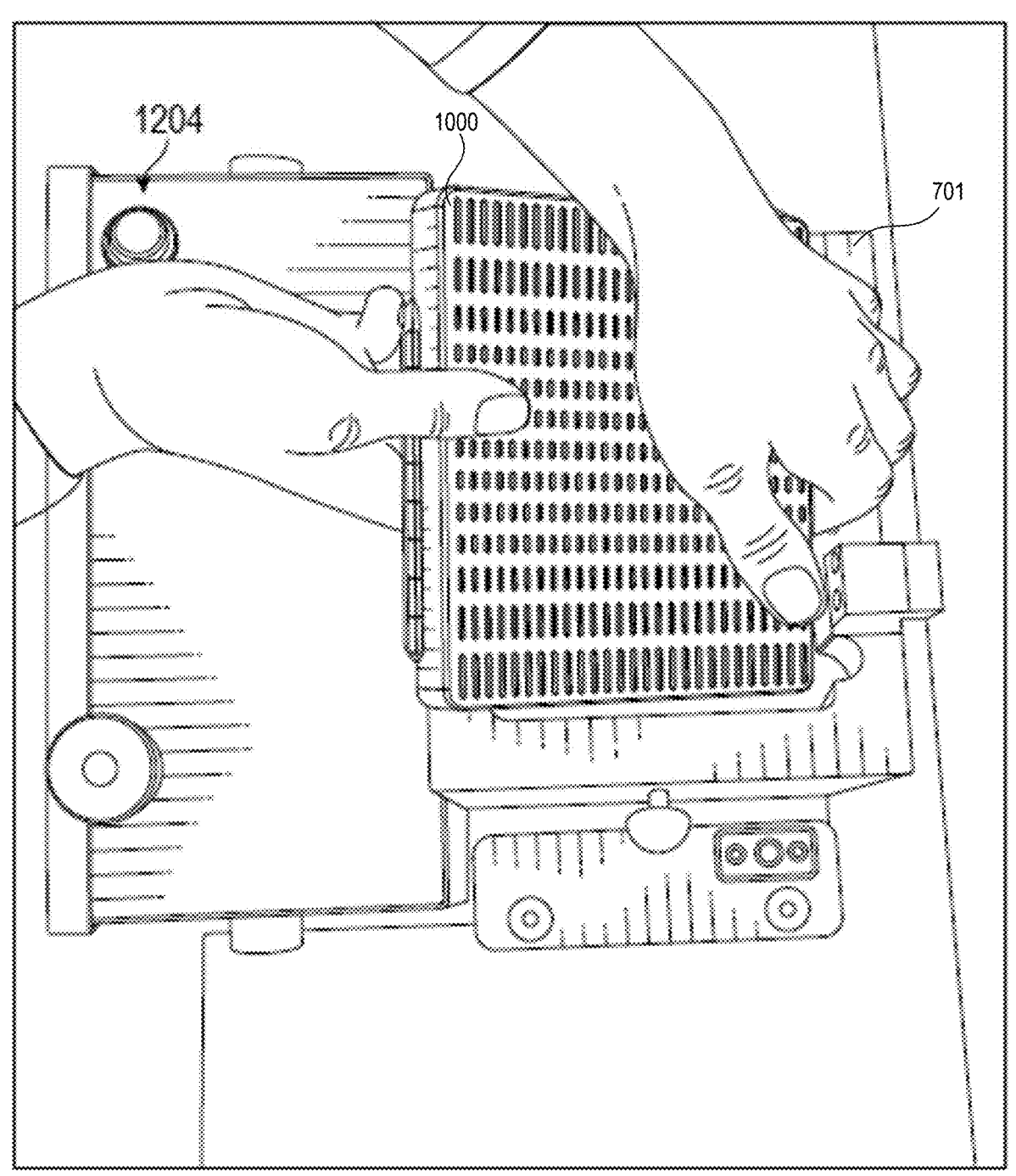
FIG. 12C is a schematic diagram showing that the light indicator has turned off and the technician is proceeding to take the receiver out of the receptacle.

FIG. 12C is a schematic diagram showing that the light indicator has turned off 1204 and the technician is proceeding to take the receiver 1000 out of the receptacle 701.

FIG. 1A is a schematic diagram of an apparatus 100 on which the receiving device (e.g., the Joey TV Receiver) can be opened, according to embodiments herein.

FIG. 1B is a schematic diagram of a magnification of the apparatus of FIG. 1A, showing the components thereof, according to embodiments herein. An identification of each component can be found in TABLE A below.

TABLE A

| ITEM NO. | PART NUMBER | DESCRIPTION | QTY. |
|---|---|---|---|
| 1 | 16556-001 | NEST | 1 |
| 2 | 16556-002 | INTERMEDIATE PLATE | 1 |
| 3 | 16556-004 | EJECTOR PIN | 4 |
| 4 | 16556-005 | VACUUM CUP MANIFOLD | 1 |
| 5 | anver-B1.5-25-NBR | VACUUM CUP | 2 |
| 6 | 16556-009 | ROTARY CYLINDER COUPLING | 4 |
| 9 | CJP2B16-25D.step_CJP2-Body_16_1 | LIFT CYLINDER | 1 |
| 11 | 16556-010 | FRONT PLATE | 1 |
| 12 | 16556-011 | SIDE PLATE | 2 |
| 13 | 16556-012 | BOTTOM PLATE | 1 |
| 14 | 6508K121 | ROTARY CYLINDER | 4 |
| 15 | 7090K390 | MICRO SWITCH | 2 |
| 16 | 7779K420 | ROLLER LEVER MINIATURE SNAP-ACTING SWITCH | 4 |
| 17 | 16556-014 | CAM, ROTARY CYLINDER | 4 |
| 18 | 16556-015 | MOUNTING BLOCK, ROTARY CYLINDER CAM SWITCH | 4 |
| 19 | 16556-016 | GUIDE PIN | 4 |
| 20 | 16556-017 | MOUNTING BRACKET, LIFT CYLINDER | 1 |
| 21 | 16556-018 | MOUNTING BRACKET, MICRO SWITCH | 1 |
| 22 | 16556-020 | LIMIT SWITCH BRACKET | 1 |
| 23 | 16556-019 | MANIFOLD | 2 |
| 24 | 91251A196 | 8-32 × ⅝" SHCS | 4 |
| 25 | 91253A006 | 10-32 × ⅝" FHS | 12 |
| 26 | 91253A199 | 8-32 × 1" FHS | 5 |
| 27 | 91251A194 | 8-32 × ½" SHCS | 2 |
| 28 | 91253A151 | 6-32 × ¾" FHS | 2 |
| 29 | 91251A342 | 10-32 × ½"SHCS | 2 |
| 30 | 91255A152 | 6-32 × ⅞" BHS | 2 |
| 31 | 6046K42 | HANDLE | 2 |
| 32 | 91251A113 | 4-40 × ¾" SHCS | 16 |
| 33 | 91251A131 | 5-40 × ¾" SHCS | 12 |
| 34 | 91375A142 | 6-32 × ⅛" SET SCREW | 8 |
| 35 | 90480A009 | 8-32 HEX NUT | 1 |
| 36 | 92313A190 | 8-32 × ¼" SET SCREW | 4 |
| 37 | 98381A471 | ⅛ × ½" DOWEL PIN | 4 |

Table A shows the reference number (Item No.), the part number, the description of each part, and the quantity of each part, in an example implementation of an embodiment. These reference numbers are used consistently herein to aid understandability of the innovation.

For some of the parts above, TABLE B is a list of their part numbers and their function or purpose.

TABLE B

| • | Part number | What it does |
|---|---|---|
| 1 | 16556-001 NEST | Is the plate the receiver rests in |
| 2 | 16556-002 INTERMEDIATE PLAT | Is a top plate that holds the frame together |
| 3 | 16556-004 EJECTOR PIN | The pin that opens the receiver |
| 4 | 16556-005 VACUUM CUP MANIFOLD | This allows air lines to come together |
| 5 | anver-B1.5-25-NBR VACUUM CUP | Creates the pressure for the suction cups |
| 6 | 16556-009 ROTARY CYLINDER COUPLING | This holds the ejector pins |
| 9 | CJP2B16-25D.step_CJP2-Body_16_1 LIFT CYLINDER | Cylinder that pushes the cam rotors up |
| 11 | 16556-010 FRONT PLATE | Front plate of machine |
| 12 | 16556-011 SIDE PLATE | Side plate of machine |
| 13 | 16556-012 BOTTOM PLATE | Bottom plate of machine |
| 14 | 6508K121 ROTARY CYLINDER | This rotates the ejector pins |
| 15 | 7090K390 MICRO SWITCH | Indicates a receiver is in place for a cycle |
| 16 | 7779K420 ROLLER LEVER MINIATURE SNAP-ACTING SWITCH | stops the rotation of the ejector pin |
| 17 | 16556-014 CAM, ROTARY CYLINDER | Rotates with the pins so it can touch the micro switch to stop the rotation once its reached the distance needed |
| 18 | 16556-015 MOUNTING BLOCK, ROTARY CYLINDER CAM SWITCH | this is the part that holds the micro switch and the rotary cylinder |
| 19 | 16556-016 GUIDE PIN | Pins that hold the top and bottom together for alignment |
| 20 | 16556-017 MOUNTING BRACKET, LIFT CYLINDER MOUNTING | BRACKET, LIFT CYLINDER |
| 21 | 16556-018 MOUNTING BRACKET, MICRO SWITCH MOUNTING | BRACKET, MICRO SWITCH |
| 22 | 16556-020 MOUNTING BRACKET, MICRO SWITCH MOUNTING | BRACKET, MICRO SWITCH |
| 23 | 16556-019 MANIFOLD | MANIFOLD for air lines |

In an embodiment, the pin is made from A1 steel and is hardened.

In an embodiment, the pin is configured with an embedded programmable logic controller (PLC) and a camshaft actuator, where the PLC is communicably connected to the micro switch and the camshaft actuator, where the PLC causes the lifting of the pin by sending a first signal to the camshaft actuator, and where, when the pin meets the micro switch, the micro switch sends a second signal to the PLC, the second signal instructing the PLC to send a third signal to the camshaft actuator to cause the camshaft actuator to turn, thereby turning the pin. In an embodiment, the PLC is nine port in and nine port out. In an embodiment, the actuator goes up and down and cams around to move the pin around.

In an embodiment, the camshaft actuator is air driven. It also has a PLC, is programmed with a PLC.

Consistent with embodiments herein, the micro switch controls the depth, how deep the air actuator pushes up. The apparatus has a micro switch that the pin touches and when the pin touches the micro switch, the micro switch tells the pin to stop. The micro switch feeds back to the PLC via sending a signal. That same micro switch feeds a signal to the rotating cams to rotate now, subsequent, because the pins are at position and need to rotate. Specifically, the micro switch sends a signal to the PLC and the PLC, via transmitting a signal, tells the cylinders to rotate. In an embodiment, once the rotation goes to the furthest point of that camshaft or cam actuator, such camshaft or cam actuator meets another micro switch, which reverses the process. The micro switch tells, sends a signal to, the actuator it has reached its position and needs to return by the delay that is programmed in the PLC.

Figure 2:
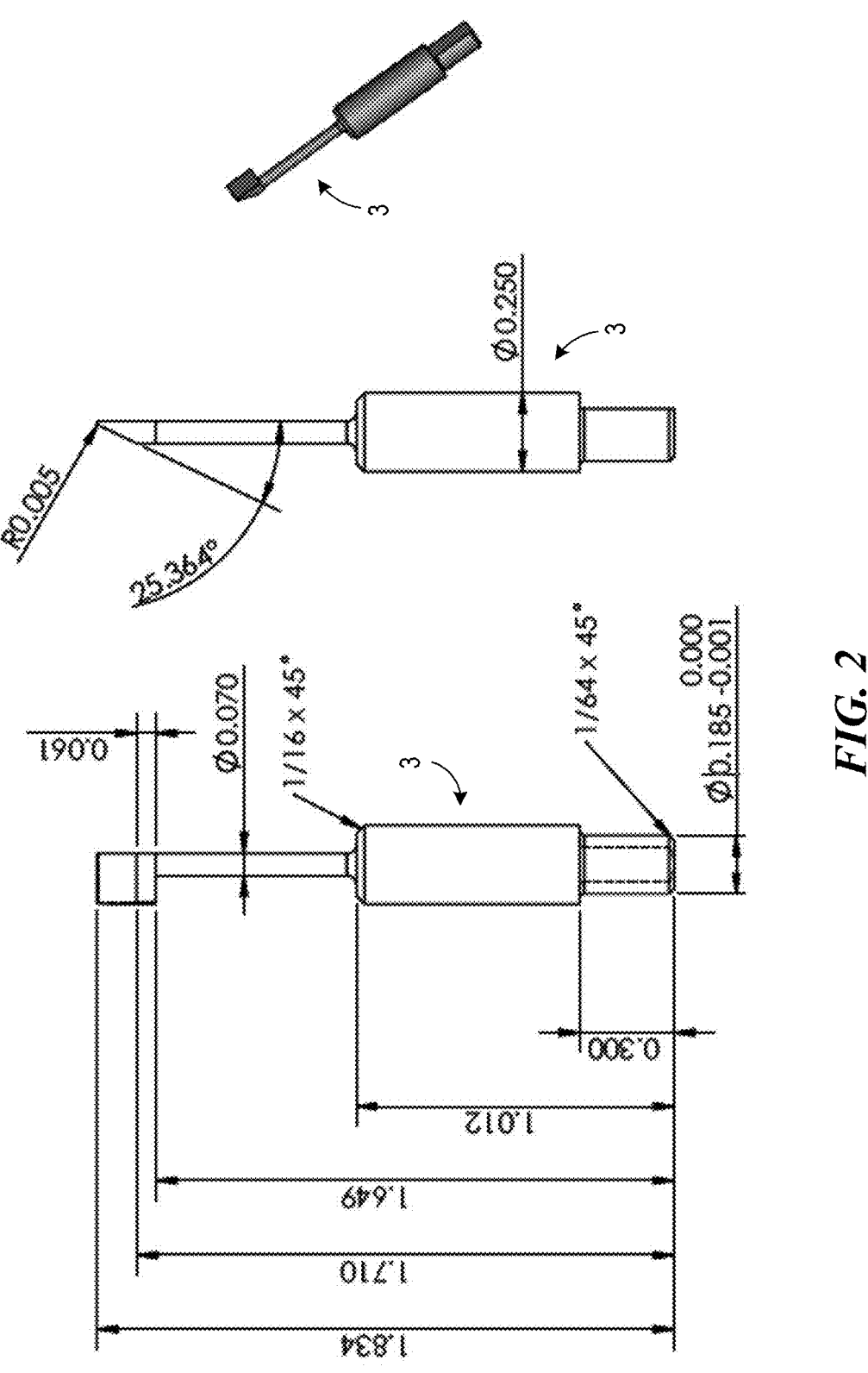
FIG. 2 is a schematic diagram of the pin, consistent with embodiments herein.

FIG. 2 is a schematic diagram of the pin 3, consistent with embodiments herein. The pin 3 shown on the far right depicts how the pin might look to a human user or machine builder. The depiction shows an angular view of the pin, so that both the beveled part of the tip and the flat, flange part of the tip are shown together.

The pin 3 in the middle shows dimensions in accordance with an implementation of an embodiment. Also shown is that the tip of the pin is beveled. The pin tip being beveled allows the pin to push past the entry of the plastic clips of the receiver. The pin 3 pushes through which makes the bevel design optimal. More specifically, in an embodiment, a tab overhangs a flat lip that locks the two clips sides of the receiver together. Such clips, with the tabs, flat lip, and two clip sides, are shown for example in FIG. 3 as items 302 and 304. The tab hangs down past the flat lip. The pins go between the tab and flap and separate them so the two receiver parts come apart.

The pin 3 on the left shows dimensions in accordance with an implementation. Here, the pin is depicted to have been turned 90%. The flat, rectangular side (e.g., flange) on the top of the pin is shown. It is the flange that pushes or presses upon the latch protrusion and optionally also the plastic clip, each inside the receiver, to cause the top of the receiver to release from the side or bottom plate of the receiver, thus opening the receiver for the technician to work upon. It should be appreciated that in other embodiments, the preferred turn angle is other than 90%, design depending.

Figure 3:
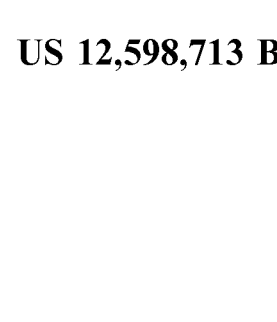
FIG. 3 is a schematic diagram of the parts of the receiver, consistent with embodiments herein.

FIG. 3 is a schematic diagram of the parts of the receiver, consistent with embodiments herein. The opening/closing clips 302 are secured in the bottom plate of the receiver. The top or front plate of the receiver has the counterpart of the clips 304 that lock into the clips 302. Put another way, on the top cover part, the receiver has a piece that goes inside and snaps into the corresponding part on the bottom plate. In an embodiment, the latch/lock mechanism works as follows. There is a tab that overhangs a flat lip that locks the two clips sides of the receiver together. The tab hangs down past the flat lip.

Figure 4:
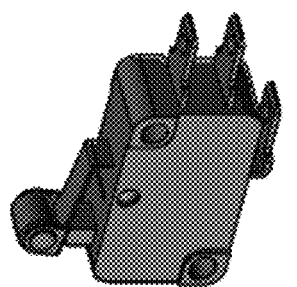
FIG. 4 is a schematic diagram showing the dimensions of an example micro switch, consistent with embodiments herein.
Figure 4:
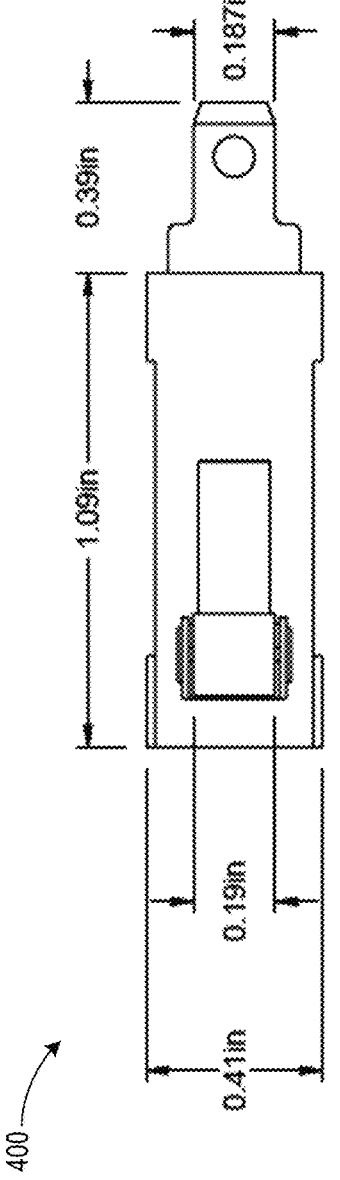
Figure 4:
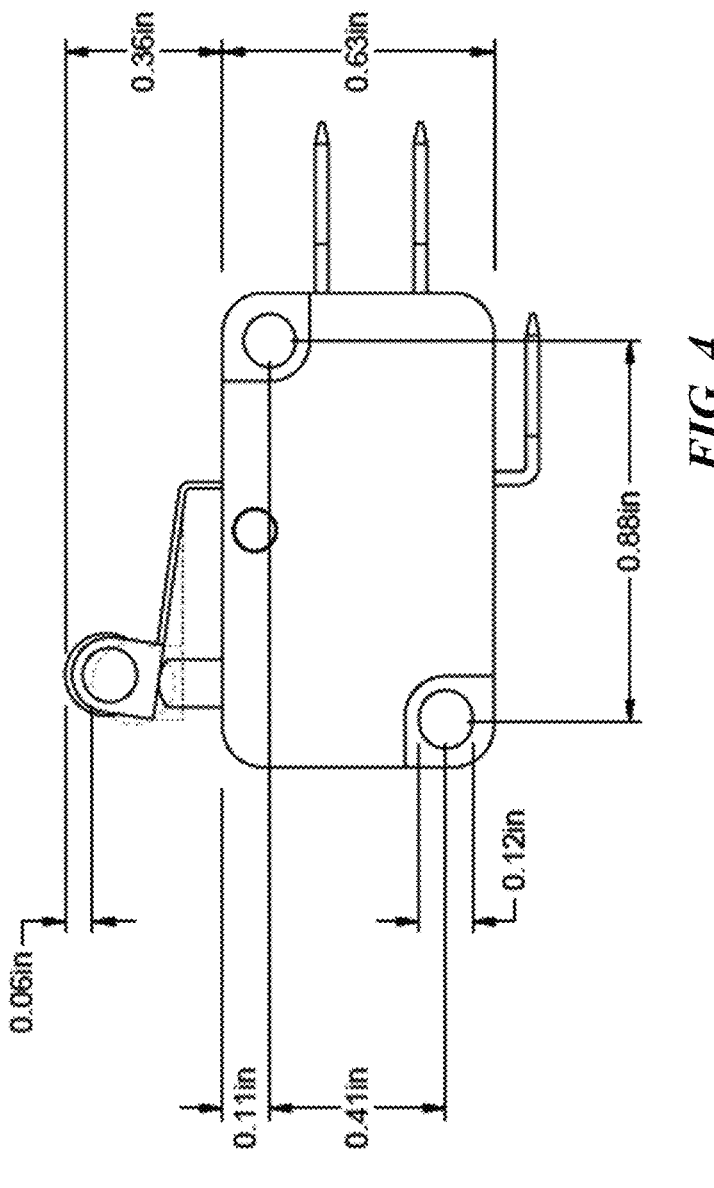

FIG. 4 is a schematic diagram showing the dimensions of an example micro switch 400, consistent with embodiments herein.

Figure 5:
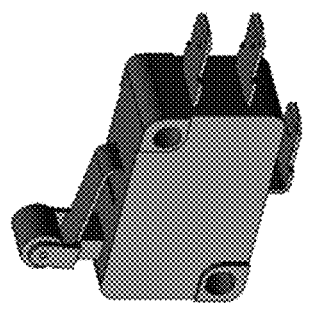
FIG. 5 is a schematic diagram showing the dimensions of an example micro switch, consistent with embodiments herein.

FIG. 5 is a schematic diagram showing the dimensions of an example micro switch 500, consistent with embodiments herein. In an embodiment, the differentiation and purposes of the two micro switches is as follows. One indicates that the receiver is in place and the other indicates that the mechanism has reached its position needed.

Figure 6B:
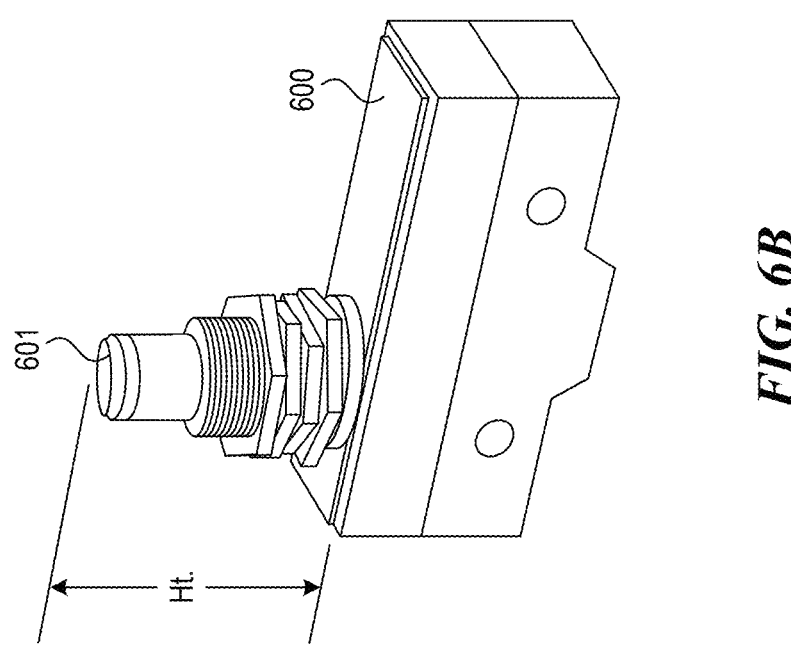
FIG. 6A-6B are each a schematic diagram showing the dimensions of an example starter switch, consistent with embodiments herein.
Figure 6A:
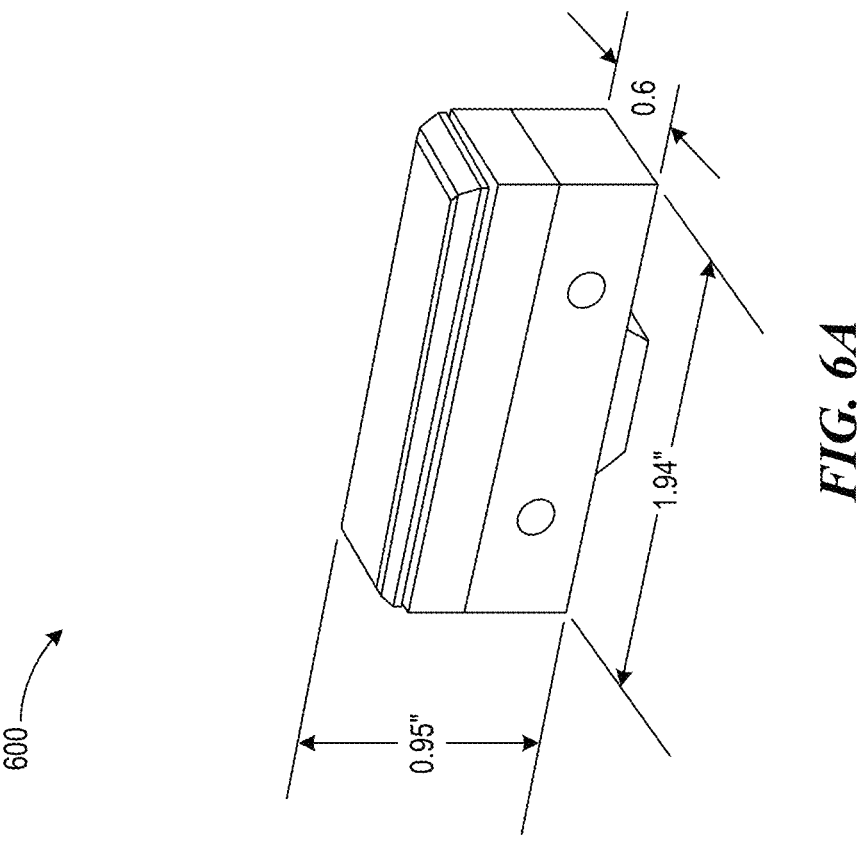

FIG. 6A-6B are schematic diagrams showing the dimensions of an example starter switch 600 and button 601, consistent with embodiments herein.

Figure 13C:
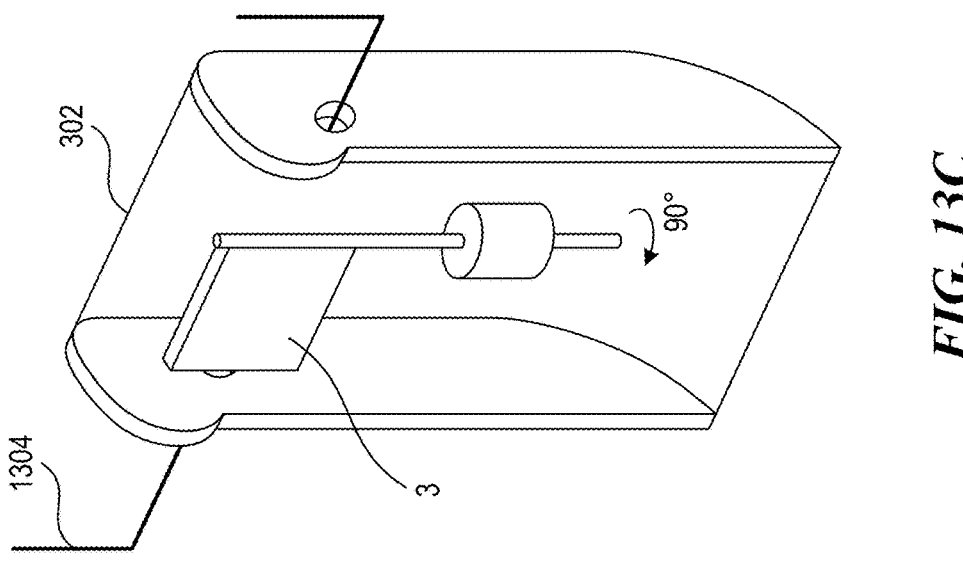
FIG. 13A-13C are each a schematic diagram showing three stages of the receiver clip being unlatched by the pin 3, consistent with embodiments herein.
Figure 13B:
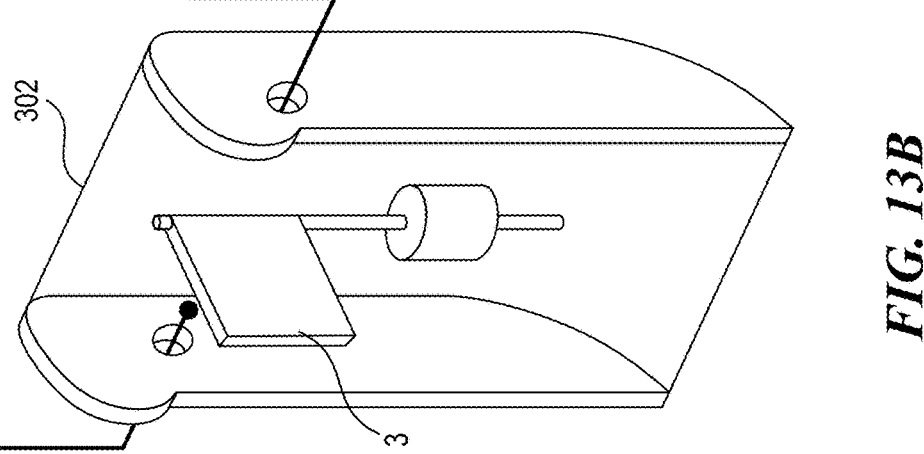
Figure 13A:
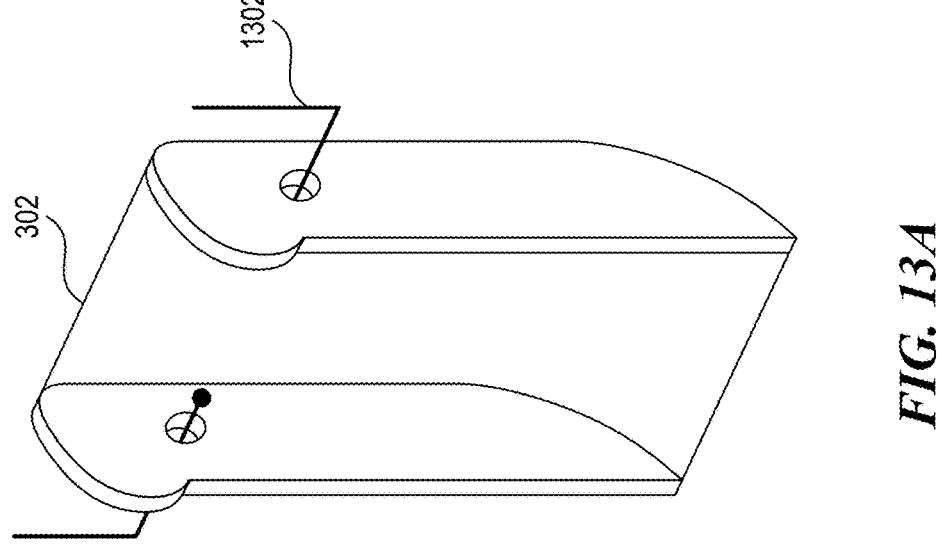

FIG. 13A-13C are each a schematic diagram showing three stages of the receiver clip 302 being unlatched by the pin 3, consistent with embodiments herein. The diagram on the left, FIG. 13A, shows the clip 302 being secured by the lock or latch 1302. The diagram in the middle, FIG. 13B, shows the arrival of the pin 3 in between two sides of the clip 302. The diagram on the right, FIG. 13C, shows the pin 3 after it has turned 90 degrees and how it had pushed against the protruding latch 1302 and released the latch 1304. The released latch is what enables the top of the receiver to pop open for technician.

REMARKS

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" or "in an embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A method for opening a receiving device mounted on a receptacle of an opening apparatus, the method, comprising:

providing at least one processor coupled to at least one memory;

initiating an opening process by activation of an activating mechanism of the opening apparatus;

responsive to the opening process being initiated, lifting a first member of the opening apparatus to move at least one pin through a hole in a bottom plate of the receiving device;

stopping the lifting when the first member meets a first micro switch;

responsive to meeting the first micro switch and stopping the lifting, turning a second member of the opening apparatus to turn the at least one pin at a predetermined number of degrees until the second member meets a second micro switch, causing the at least one pin to push out at least one protrusion of the bottom plate from engaging a surface of the receiving device that maintains the receiving device closed, the pushing out of the at least one protrusion causing a front plate of the receiving device to release from a side plate of the receiving device, thereby opening the receiving device.

2. The method of claim 1, wherein the pin is configured to have a rectangular flat part, thereby causing a latch to push out when the pin is turned.

3. The method of claim 1, wherein the receiving device is an entertainment electronic device communicably connected to a streaming device, the receiving device configured for receiving programmable content from a content broadcast provider and configured for recording the content.

4. The method of claim 1, wherein the bottom plate is held in place by at least one suction cup.

5. The method of claim 1, wherein the predetermined number of degrees is substantially 90 degrees.

6. The method of claim 1, wherein the opening process is on a timed cycle, the timed cycle comprising a predetermined amount of time past the initiating the opening process that provides time for operations: (a) turning the at least one pin in a reverse direction and (b) subsequently lowering the at least one pin back through the hole in the bottom plate.

7. The method of claim 1, wherein the at least one pin is configured with an embedded programmable logic controller (PLC) and a camshaft actuator, wherein the PLC is communicably connected to the first micro switch and the camshaft actuator;

wherein the PLC causes the lifting of the at least one pin by sending a first signal to the camshaft actuator;

wherein, when the first member meets the first micro switch, the first micro switch sends a second signal to the PLC, the second signal instructing the PLC to send a third signal to the camshaft actuator to cause the camshaft actuator to turn, thereby turning the pin.

8. The method of claim 7, further comprising stopping the turning when the second member meets the second micro switch, causing the second micro switch to send a fourth signal to the PLC, the fourth signal instructing the PLC to send a fifth signal to the camshaft actuator, the fifth signal instructing the camshaft actuator to stop and reverse turn.

9. The method of claim 8, wherein the second micro switch is a miniature snap-acting switch.

10. The method of claim 1, wherein the at least one protrusion is a latch protrusion of a lock mechanism, the lock mechanism comprising a latch arm and the latch protrusion protruding through a hole in a plastic clip of the receiving device.

11. An apparatus for opening a receiving device mounted on a receptacle of the apparatus, comprising:

a panel comprising at least one processor coupled to at least one memory;

an activating mechanism on the panel configured to initiate an opening process by activation of the activating mechanism;

an ejector pin for opening the receiving device;

a rotary cylinder coupling configured to hold the ejector pin;

a first rotary cylinder configured to rotate the ejector pin;

a lift cylinder configured to push up the rotary cylinder to lift a first member of the apparatus to move the ejector pin through a hole in a bottom plate of the receiving device;

a first micro switch configured to indicate that receiving device is in place for a cycle of the opening process;

a second micro switch configured to stop the rotation of the ejector pin when a second member of the apparatus meets the second micro switch;

a cam rotary cylinder configured to rotate the second member of the apparatus to turn the ejector pin enabling the second member to touch the second micro switch to stop the rotation indicating that the pin has reached a required distance;

wherein the rotation of the pin causes the pin to push out at least one protrusion of the bottom plate from engaging a surface of the receiving device that maintains the receiving device closed, the pushing out of the at least one protrusion causing a front plate of the receiving device to release from a side plate of the receiving device, thereby opening the receiving device.

12. The apparatus of claim 11, wherein the pin is configured to have a rectangular flat part, thereby causing a latch to push out when the pin is rotated.

13. The apparatus of claim 11, wherein the receiving device is an entertainment electronic device communicably connected to a streaming device, the receiving device configured for receiving programmable content from a content broadcast provider and configured for recording the content.

14. The apparatus of claim 11, wherein the bottom plate is held in place by at least one suction cup.

15. The apparatus of claim 11, wherein the rotation of the pin is substantially 90 degrees.

16. The apparatus of claim 11, further comprising a time cycle, wherein the opening process is programmed to execute based on the timed cycle, the timed cycle comprising a predetermined amount of time past the initiation of the opening process to provide time for operations: (a) to turn the pin in a reverse direction and (b) subsequently lower the pin back through the hole in the bottom plate.

17. The apparatus of claim 11, wherein the pin is configured with an embedded programmable logic controller (PLC) and a camshaft actuator, wherein the PLC is communicably connected to any of: the first micro switch, the second micro switch, the first rotary cylinder, the lift cylinder, or the cam rotary cylinder;

wherein the PLC causes the lifting of the pin by sending a first signal to the cam rotary cylinder;

wherein, when the pin meets the second micro switch, the second micro switch sends a second signal to the PLC, the second signal instructing the PLC to send a third signal to the cam rotary cylinder to cause the cam rotary cylinder to turn, thereby turning the pin.

18. The apparatus of claim 17, further comprising an operation of stopping the turning when the pin meets the second micro switch, causing the second micro switch to send a fourth signal to the PLC, the fourth signal instructing the PLC to send a fifth signal to the cam rotary cylinder, the fifth signal instructing the camshaft actuator to stop and reverse turn.

19. The apparatus of claim 18, wherein the second micro switch is a miniature snap-acting switch.

20. The apparatus of claim 11, wherein the at least one protrusion is a latch protrusion of a lock mechanism, the lock mechanism comprising a latch arm and the latch protrusion protruding through a hole in a plastic clip of the receiving device.

\* \* \* \* \*